United States Patent [19]
Tanaka

[11] Patent Number: 4,567,468
[45] Date of Patent: Jan. 28, 1986

[54] MODULATION CIRCUIT OF A DIGITAL-TO-ANALOG CONVERTER

[75] Inventor: Shinichi Tanaka, Kashihara, Japan

[73] Assignee: Sharp Kabushiki Kaisha, Osaka, Japan

[21] Appl. No.: 535,310

[22] Filed: Sep. 23, 1983

[30] Foreign Application Priority Data

Sep. 24, 1982 [JP] Japan .................. 57-166853

[51] Int. Cl.[4] ........................... H03K 13/02
[52] U.S. Cl. ................. 340/347 DA; 332/9 R
[58] Field of Search ............ 340/347 AD, 347 DA; 318/599; 332/9 R

[56] References Cited

U.S. PATENT DOCUMENTS

| | | | |
|---|---|---|---|
| 3,707,713 | 12/1972 | Diaz | 340/347 DA |
| 3,823,396 | 7/1974 | Lode | 340/347 DA |
| 4,095,218 | 6/1978 | Crouse | 340/347 DA |
| 4,096,475 | 6/1978 | Ong | 340/347 DA |
| 4,209,775 | 6/1980 | Kawashima | 340/347 DA |
| 4,400,692 | 8/1983 | Klein | 340/347 DA |
| 4,467,319 | 8/1984 | Uchikoshi | 340/347 DA |

Primary Examiner—B. Dobeck
Attorney, Agent, or Firm—Birch, Stewart, Kolasch & Birch

[57] ABSTRACT

A modulation circuit of a D/A converter comprises a pulse number modulation circuit for modulating some bits of digital data and for dispersing a pulse or pulses in one or more resultant pulses, a pulse width modulation circuit for modulating the remain bits of the digital data and for dividing pulses in a resultant pulse train and a combination circuit for combining and positioning at least one pulse in the pulse train adjacent the pulse or pulses in the one or more resultant pulses formed by the pulse number modulation circuit.

18 Claims, 8 Drawing Figures

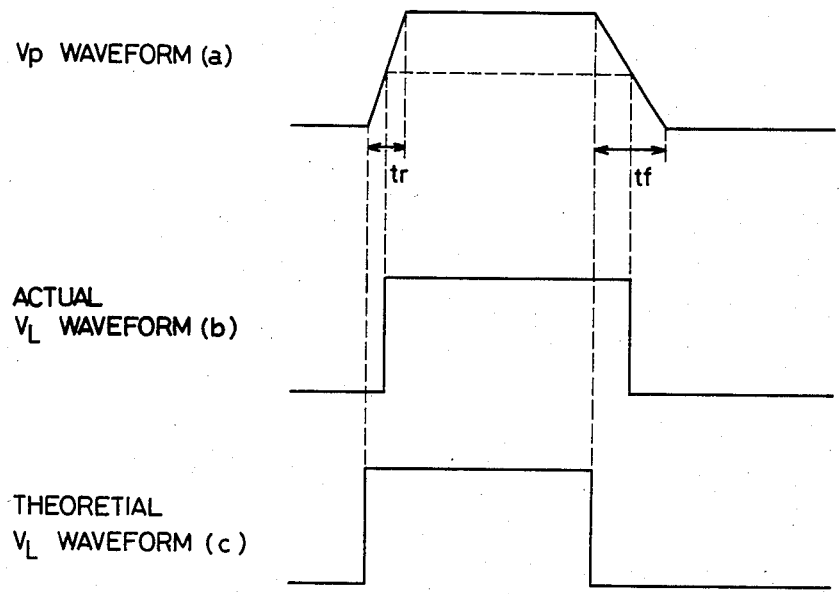
FIG.4
FIG.5
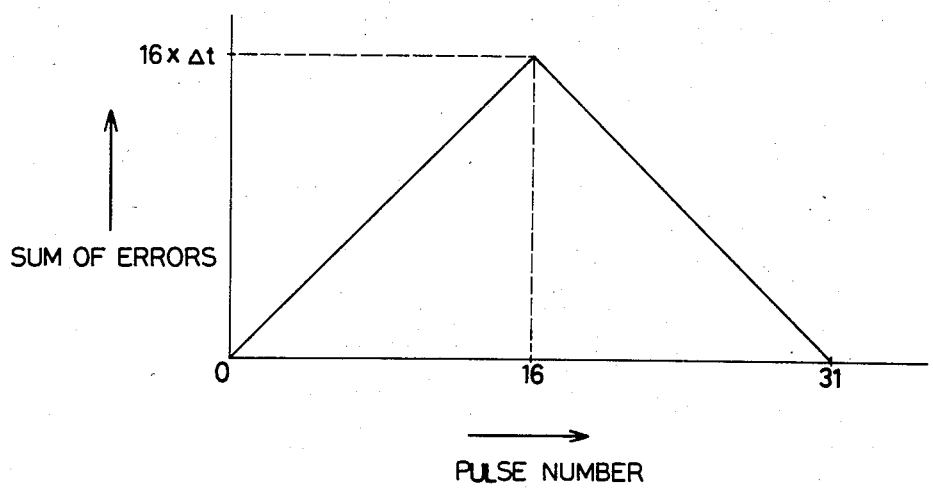

MODULATION CIRCUIT OF A DIGITAL-TO-ANALOG CONVERTER

BACKGROUND OF THE INVENTION

The present invention relates to a modulation circuit of a digital-to-analog converter.

When conventional digital-to-analog conversion (D/A conversion) is executed, digital codes are converted to a pulse or a pulse train having a predetermined pulse width in a predetermined conversion period.

In FIG. 1, a digital circuit 1 outputs bit data $D_N-D_1$ each bit of which is generated from each of terminals $D_{NT}-D_{1T}$, and this bit data $D_N-D_1$ to be converted to analog data is input to a modulation circuit 3 of a digital-to-analog (D/A) converter 10. Each bit of digital data (digital codes) D is each output from the terminals $D_{NT}-D_{1T}$. For example, when N=5 (bits), $D=D_5D_4D_3D_2D_1$. A binary counter 2 outputs signals $Q_N-Q_1$ for preparing timing signals for the D/A conversion, and the signals $Q_N-Q_1$ are input to the modulation circuit 3. A clock signal $\phi$ is inputted to the binary counter 2 to decide a minimum unit time of the D/A conversion. The modulation circuit 3 outputs an output voltage $V_P$ comprising a pulse or a pulse train having a predetermined pulse width as a whole in a predetermined conversion period in accordance with the bit data $D_N-D_1$ and the signals $Q_N-Q_1$. The level of the output voltage $V_P$ is converted to the level of an output voltage $V_L$ by a level conversion circuit 4 to finally obtain an output voltage $V_A$ as analog data having a proper voltage level through an integration circuit 5.

FIG. 2 shows a relationship between a clock signal $\phi$ and signals $Q_N-Q_1$ of the binary counter 2 when N=5 (bits). In this example, N is set to 5 for convenience in explaining the D/A conversion system of the present invention. When N=5 (bits), a conversion period T is $32t(=2^5t)$. (t: a minimum unit time for the D/A conversion)

Pulse width modulation (PWM) and pulse number modulation (PNM) are known as conventional methods for preparing the output voltage $V_P$ as shown in FIG. 3. Pulse width modulation enables the output voltage $V_P$ to output as a continuous pulse. Pulse number modulation enables output voltage $V_P$ to output as a combination of pulse trains with the minimum unit time t as a unit width. In pulse number modulation, though the pulse number of the output voltage $V_P$ increases between D=00001 and D—10000, the pulse number of the output voltage $V_P$ decreases between D=10001 and D=11111 because the waveform of the output voltage $V_P$ of D=00001—D32 01111 are superimposed on the waveform of the output $V_P$ of D=10000.

The high level period $T_P$ of the output voltage $V_P$ of the same digital data D within the conversion period T in the above methods occupies a same period, so that the value of analog data $V_A$ in the both methods is identical. The high level period $T_P$ is expressed as follows.

$$T_P = t(2^4 \times D_5 + 2^3 \times D_4 + 2^2 \times D_3 + 2^1 \times D_2 + 2^0 \times D_1)$$

Accordingly, in the both methods, the same digital data is converted as a pulse or a pulse train with an identical pulse width as a whole within the conversion period T.

However, the above methods have problems as follows. In the pulse width modulation, if a time constant of the integration circuit 5 is not large, a ripple is added to the waveform of the output voltage $V_A$ as analog data. Conversely, if the time constant is set large, a response against the bit data $D_N-D_1$ become improper.

In the pulse number modulation, on the contary, a time constant may be selected to be smaller than the time constant of the integration circuit 5 in the pulse width modulation except the maximum region and the minimum region of the digital data D. But, as shown in FIG. 4, an actual waveform (a) of the output voltage $V_P$ shows a rise time (tr) and a fall time (tf). When the level of the actual waveform (a) of the output voltage $V_P$ is converted by 50% of an amplitude, the level converted waveform (b) (the actual waveform (b) of the output voltage $V_L$) is output. Width error ($\Delta t$) between the actual waveform (b) and a theoretical waveform (c) of the output voltage $V_L$ is inevitably produced and expensed as follows.

$$\Delta t = \frac{tr - tf}{2}$$

As this width error ($\Delta t$) becomes an error of one pulse, the width error of the digital data at D=10000 becomes a maximum as shown in FIG. 5. The width error ($\Delta t$) varies in accordance with the digital data value. If the value of the width error ($\Delta t$) shows an identical value, the width error can be compensated externally. On the contary, the width of the pulse width modulation shows as an identical value regardless of the digital data value.

SUMMARY OF THE INVENTION

An object of the present invention is to provide an improved modulation circuit of a D/A converter for modulating digital data by using a combination of pulse number modulation and a pulse width modulation.

An another object of the present invention is to provide an improved modulation circuit of D/A converter which produces only a constant width error in normal operation.

Other objects and further scope of applicability of the present invention will become apparent from the detailed description give hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, a modulation circuit of a D/A converter comprises pulse number modulation means for modulating some bits of digital data and for dispersing one or more resultant pulses, pulse width modulation means for modulating the remaining bits of the digital data and for dividing pulses in a resultant pulse train and combination means for combining and positioning at least one pulse in the pulse train formed by the pulse width modulation means adjacent the resultant pulse or pulses formed by the pulse number modulation means.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 4 is a timechart of signals in the conventional D/A conversion system;

FIG. 5 shows a graph representative of width error in pulse number modulation;

DETAILED DESCRIPTION OF THE INVENTION

Figure 6:
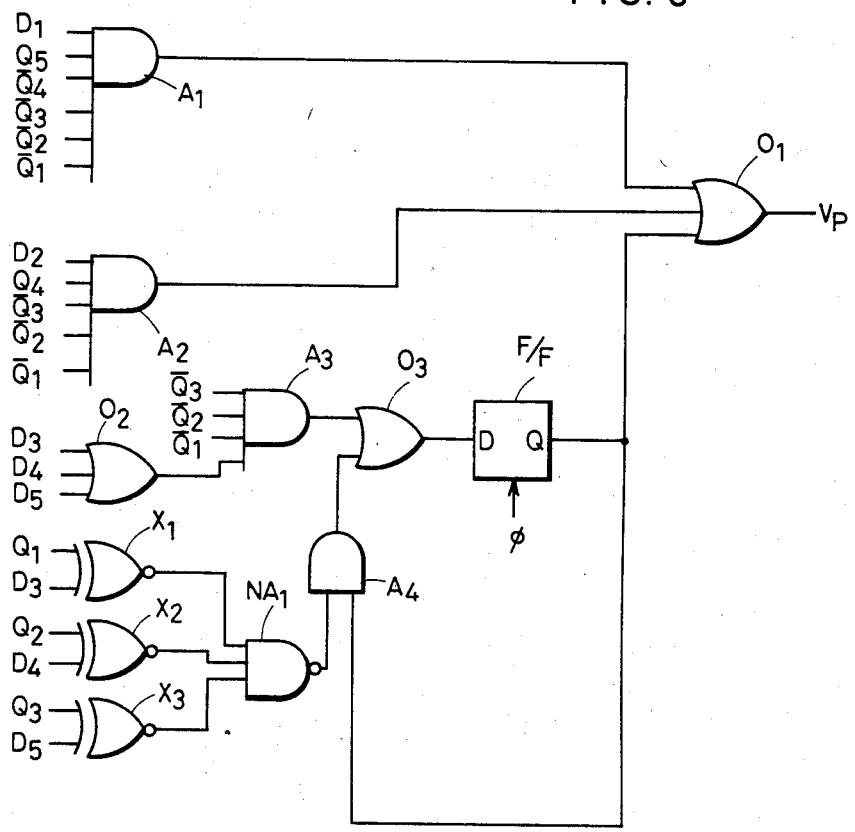
FIG. 6 is a circuit diagram of an embodiment of a modulation circuit of a D/A conversion circuit of the present invention.
Figure 7:
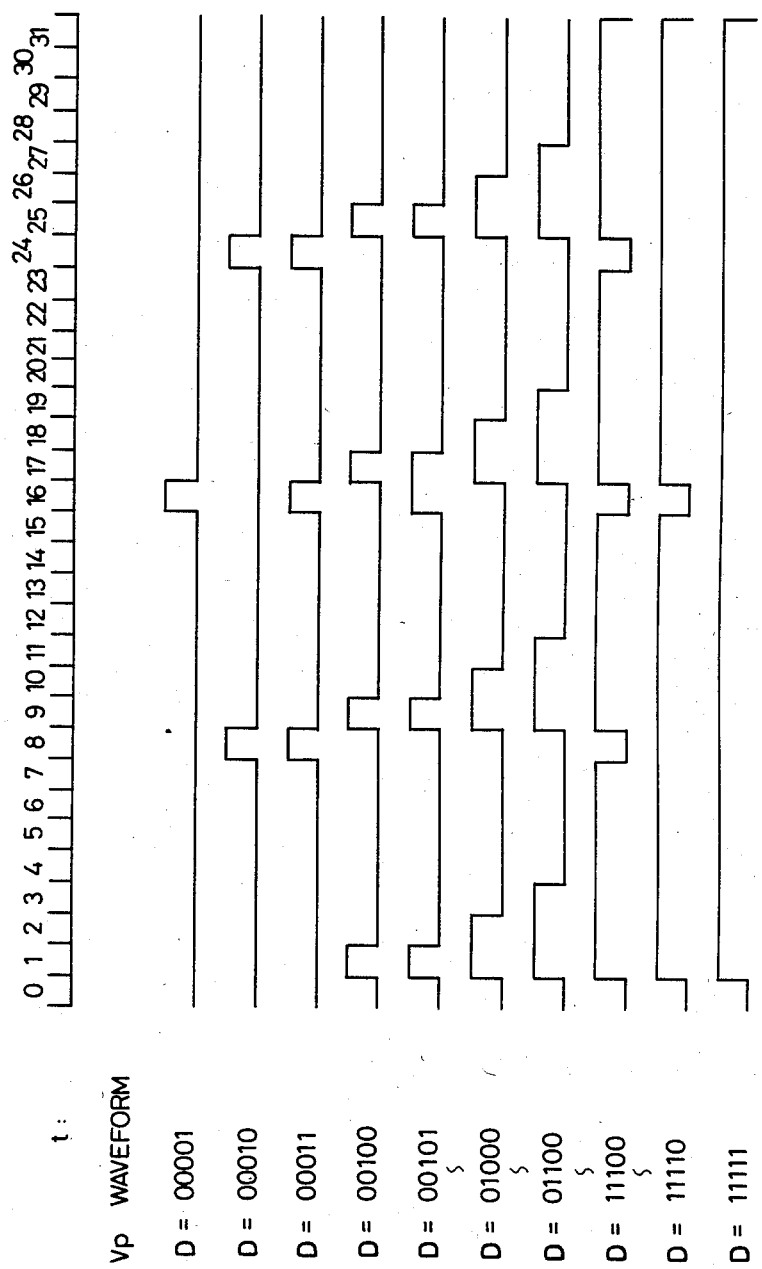
FIG. 7 is a timechart of waveforms of an output voltage $V_P$ of an embodiment of the present invention.

FIG. 6 is a circuit diagram of a modulation circuit of a D/A converter of the present invention. FIG. 7 is a timechart of waveforms of an output voltage $V_P$.

The following is an explanation of the D/A conversion when $N=5$ (bits). In the embodiment of the present invention, lower 2 bits in 5 bits of digital data (digital codes) are modulated by a pulse mumber modulation, and upper 3 bits are modulated by a pulse width modulation, and then these modulated results are combined to convert to anlog data.

Figure 1:
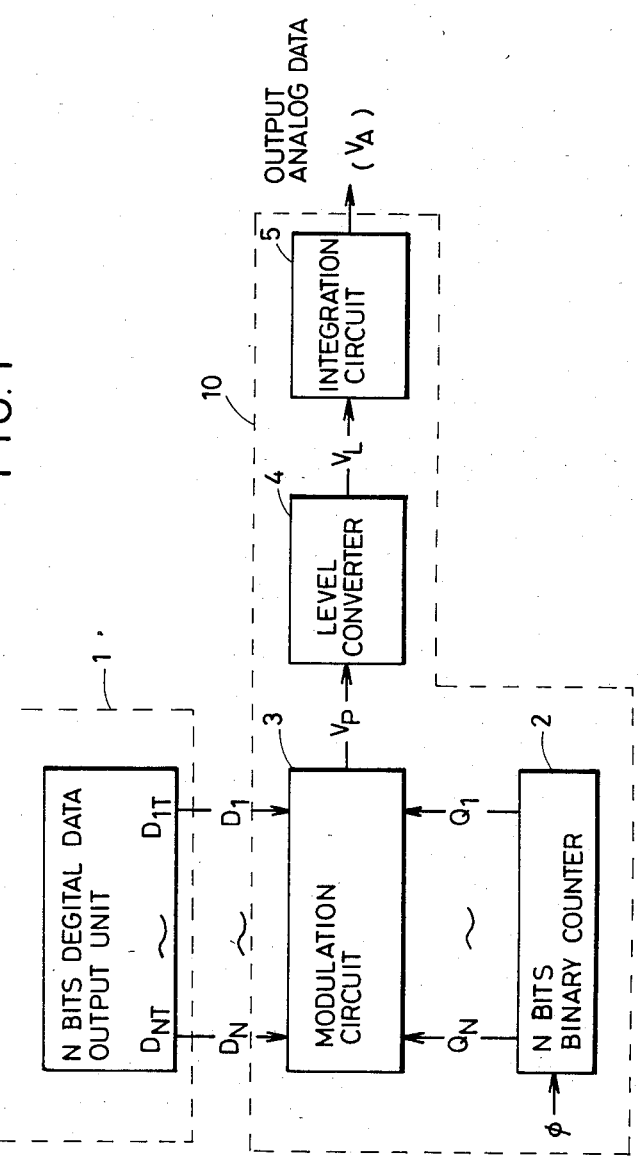
FIG. 1 is a block diagram of a fundamental D/A conversion system.
Figure 2:
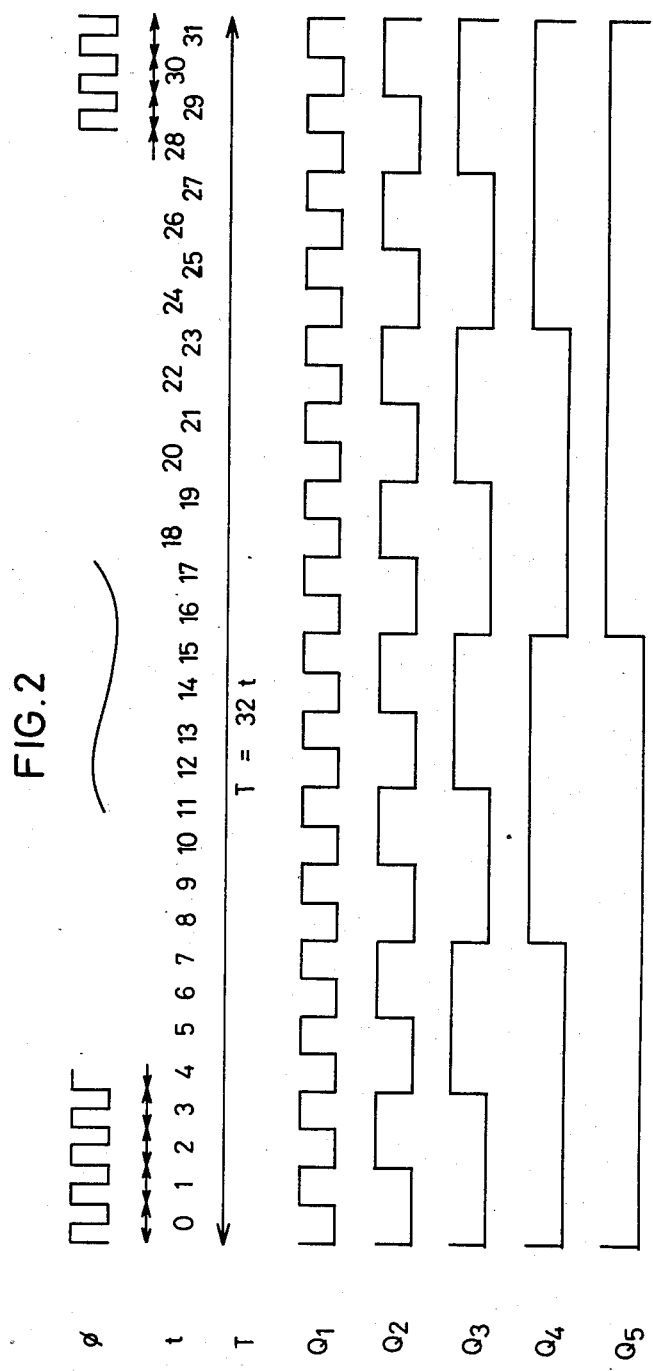
FIG. 2 is a relationship between a clock signal $\phi$ and signals $Q_N-Q_1$ of a binary counter when $N=5$ (bits)
Figure 3:
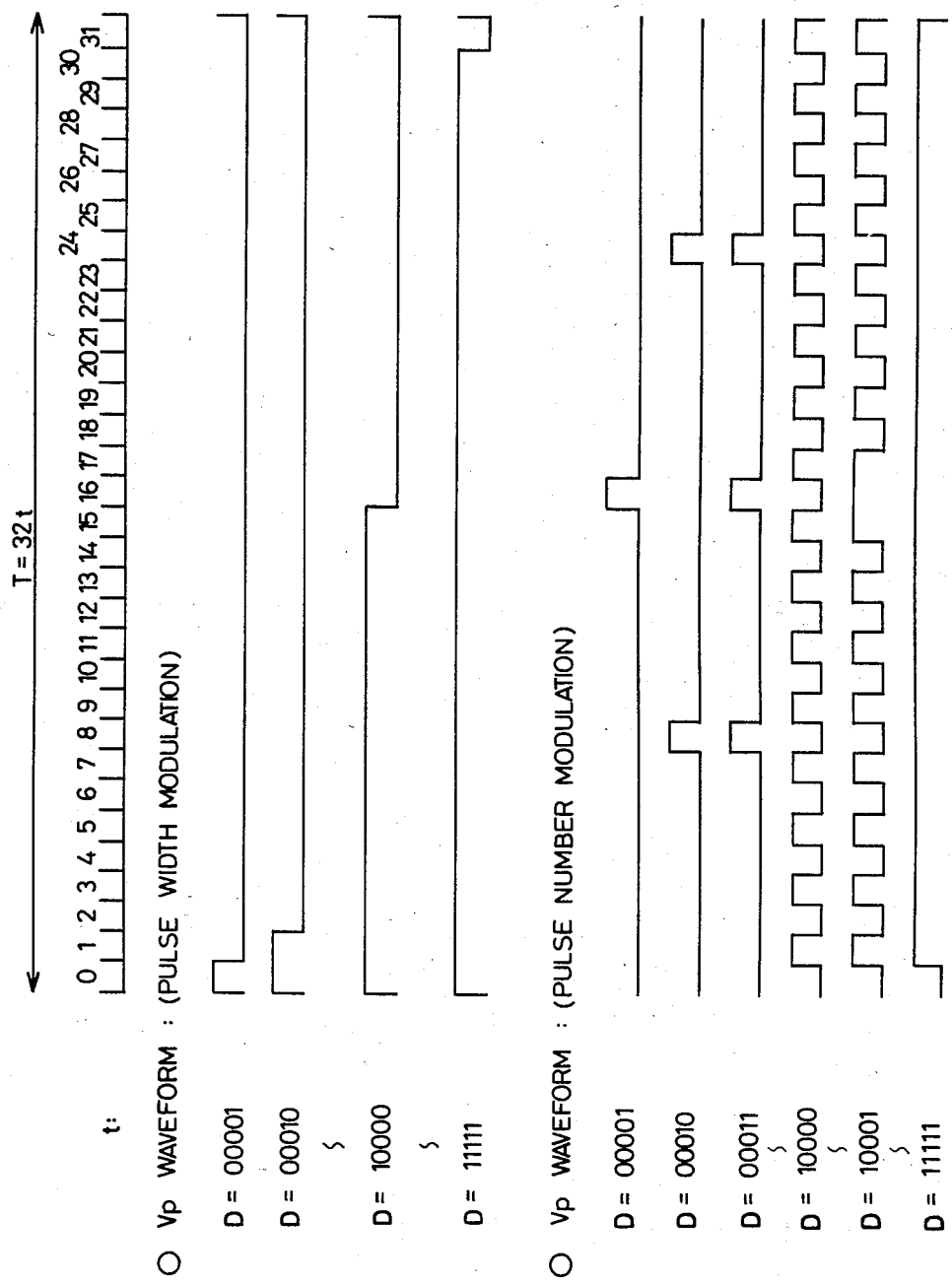
FIG. 3 is a timechart of waveforms of an output voltage $V_P$ of the conventional conversion methods.

In FIG. 6, the signals $Q_1-Q_5$ and the clock signal $\phi$ as shown in FIG. 2 are used. AND gates $A_1$ and $A_2$ modulate bit data $D_1$ and $D_2$ as the lower 2 bits by the pulse number modulation. The bit data $D_1$ and the signals $Q_5$, $\overline{Q}_4$, $\overline{Q}_3$, $\overline{Q}_2$ and $\overline{Q}_1$ are inputted to the AND gate $A_1$. The bit data $D_2$ and the signals $Q_4$, $\overline{Q}_3$, $\overline{Q}_2$ and $\overline{Q}_1$ are inputted to the AND gate $A_2$. The outputs of the AND gates $A_1$ and $A_2$ are output as an output voltage $V_P$ via an OR gate $O_1$.

Bit data $D_3$, $D_4$ and $D_5$ of the upper 3 bits are inputted to an OR gate $O_2$. When either of the bit data $D_3$, $D_4$ and $D_5$ is high, the OR gate $O_2$ outputs as output at a timing when $\overline{Q}_3\overline{Q}_2\overline{Q}_1=$"HIGH" under the control by an AND gate $A_3$. The output of the AND gate $A_3$ is inputted to a D-type flip-flop F/F having a clock signal $\phi$ via an OR gate $O_3$, so that the output of the AND gate $A_3$ is delayed by a single clock. The delayed output of the D-type flip-flop F/F is entered into the OR gate $O_1$, so that the OR gate $O_1$ outputs the output voltage $V_P$. The outputs from the D-type flip-flop F/F at $t=1$, 9, 17, 25 are used as the base of the pulse width modulation of the upper 3 bits. At least one of pulses from D-type flip-flop F/F is neighbored with a pulse or pulses dispersed within a period T by the pulse number modulation of the lower 2 bits. When the bit data $D_1=D_2=0$, the OR gate $O_1$ outputs only the output from the D-type flip-flop F/F as the output voltage $V_P$.

Initially, at $t=0$, (or 8, 16, 24), when $D_3$ or $D_4$ or $D_5=1$, the output of the AND gate $A_3$ is inputted into the OR gate $O_3$, so that the OR gate $O_3$ receives the high level signal from the AND gate $A_3$ and the low level signal from an AND gate $A_4$. The OR gate $O_3$ outputs the high level signal, so that the D-type flip-flop F/F is set and the set condition of the D-type flip-flop F/F is continued until the AND gate $A_4$ outputs the next low level signal. The D-type flip-flop F/F outputs an output delayed by a single clock. The AND gate $A_4$ outputs the low level signal when the AND gate $A_4$ receives the low level signal from an NAND gate $NA_1$. Then, the OR gate $O_3$ receives the low level signal from the AND gate $A_4$ and the low level signal from the AND gate $A_3$, so that the OR gate $O_3$ outputs to low level signal into the D-type flip-flop F/F. Responsive to the low level signal fom the OR gate $O_3$, the D-type flip-flop F/F is reset, so that the D-type flip-flop F/F outputs the low level signal until the AND gate $A_3$ outputs the next high level signal. Thus, the output of the NAND gate $NA_1$ defines the reset timing of the D-type flip-flop F/F and the width of the high level interval of the output voltage $V_P$. When $t=0, 8, 16, 24$, the same operations are repeated at four times. Accordingly, the pulse train within the period T is divided to four pulses for the pulse width modulation of the upper 3 bits. Exclusive NOR gates $X_1$, $X_2$ and $X_3$, the NAND gate $NA_1$ and the AND gate $A_4$ control the input of the D-type flip-flop F/F after the level of the signals $\overline{Q}_3\overline{Q}_2\overline{Q}_1=$"HIGH"($t=0,8,16,24$).

The signal $Q_1$ and the bit data $D_3$ are inputted to the exclusive NOR gate $X_1$, and the signal $Q_2$ and the bit data $D_4$ are inputted to the exclusive NOR gate $X_2$, and the signal $Q_3$ and the bit data $D_5$ are inputted to the exclusive NOR gate $X_3$.

The outputs of the exclusive NOR gates $X_1$, $X_2$ and $X_3$ are inputted to the NAND gate $NA_1$ to detect a predetermined timing after the level of the signals $\overline{Q}_3\overline{Q}_2\overline{Q}_1=$"HIGH". The timing signals are output in accordance with the contents of the bit data $D_3$, $D_4$ and $D_5$. When all pairs of the bit data $D_3$ and the signal $Q_1$, the bit data $D_4$ and the signal $Q_2$, the bit data $D_5$ and the signal $Q_3$ are equal, respectively, the level of the timing signal is low. When at least one pair of the bit data $D_3$ and the signal $Q_1$, the bit data $D_4$ and the signal $O_2$, the bit data $D_5$ and $Q_1$ are not equal, the level of the timing signal is high. For example, the output of the NAND gate $NA_1$ is low only when $D_5D_4D_3=001(t=1,9,17,25), =010(t=2, 10, 18, 26)$, and $=011(t=3, 11, 19, 27)$ and the like. The output of the NAND gate $NA_1$ is inputted to the AND gate $A_4$ with the output of the D-type flip-flop F/F. The output of the AND gate $A_4$ is inputted to the input terminal of the D-type flip-flop F/F via the OR gate $O_3$.

As described above, when the level of either of the bit data $D_3$, $D_4$ and $D_5$ as the upper 3 bits shows high, the high level signal of the output voltage $V_P$ is delayed by a single clock of the D-type flip-flop F/F, and after that, the input terminal of the D-type flip-flop F/F is controlled according to the contents of the bit data $D_3$, $D_4$ and $D_5$. The high level of the output voltage $V_P$ is continued until the D-type flip-flop F/F receives a low signal by the clock signal $\phi$.

A pulse chain is divided to 4 parts to modulate the upper 3 bits by the pulse width modulation. The pulse width of the 4 pulses increase or decrease by the bit data $D_3$, $D_4$ and $D_5$, based on the first delayed output (the high level signals from the D-type flip-flop F/F at $t=1$, 9, 17, 25).

Pulses produced by the pulse number modulation with the lower 2 bits generates from the OR gate $O_1$ in accordance with the timing before delayed. This pulse number modulation results are connected and combined with any four pulses modulated by the pulse width modulation, depending on the form of the lower 2 bits. The pulse width of the combined pulses which are defined by the lower 2 bits is increased as such.

Figure 8:
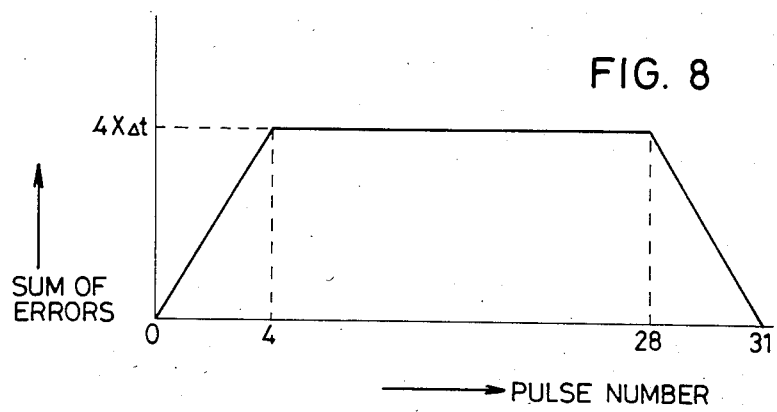
FIG. 8 shows a graph representative of width error in a modulation circuit of a D/A converter of the present invention.

FIG. 8 shows a graph representative of width error property when N=5 (bits). The pulse number is constant except the minimum region and the maximum region of the digital data D, for example, when N=5 (bits), the pulse number 4. The width error is a constant error 4×Δt in a normal condition. Four dispersed pulses are present within the period T, and the time constant of the integrated circuit may be small.

A tuning voltage for supplying to a tuner of the television set needs to be high precise voltage about 13 bits. Accordingly, the modulation circuit of the D/A converter of the present invention can be usefully used as an electronic tuning technique.

In the present invention, all of N bit data are not needed to divide to upper m bits and lower n bits (N=n+m), for example, some bits can be used as fixed bit data.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method of converting a data train of digital data codes into an analog representation thereof, said digital data codes including an N bit higher order code portion and an M bit lower order code portion, where N and M are natural numbers, comprising the steps of:
   converting each said digital data code into a code train of pulses, said code train of pulses being developed over a predetermined time period, a said digital data code representative of zero being converted by said step of converting into an absence of pulses during said predetermined time period; and
   integrating each said code train of pulses developed by said step of converting to develop an analog valve associated therewith and thereby develop an analog waveform from said data train;
   said step of converting including the steps of,
   pulse number modulating said M bit lower order code portion of each said digital data code to develop a number of pulses in said code train of pulses equal to the digital value of said M bit lower order code portion,
   pulse width modulating said N bit higher order code portion of each said digital data code to develop a plurality of width modulated pulses in said code train of pulses one greater in number than the maximum number of pulses developed by said step of pulse number modulating, each of said plurality of width modulated pulses increasing in width in relation to the digital value of said N bit higher order code portion.

2. The method of claim 1 wherein said digital data codes are binary codes.

3. The method of claim 1 wherein said code train of pulses are of unitary voltage magnitude.

4. The method of claim 1 wherein said width modulated pulses developed by said step of pulse width modulating are produced at equidistant intervals in said predetermined time period.

5. The method of claim 5 wherein the pulses developed by said step of pulse number modulating, when less than said maximum number, are produced at only certain of said equidistant intervals.

6. The method of claim 1 wherein M is equal to two and N is equal to three.

7. The method of claim 1 wherein a said digital data code representing a maximum number representable is converted by said step of converting into a single pulse having a width substantially equal to said predetermined time duration.

8. The method of claim 1 wherein said step of pulse width modulating locates all but one of said width modulated pulses in juxtaposition to the location of a one of said maximum number of pulses developed by said step of pulse number modulating.

9. An analog to digital converter for converting a data train of digital data codes into an analog representation thereof, said digital data codes including an N bit higher order code portion and an M bit lower order code portion, where N and M are natural numbers, comprising:
   means for converting each said digital data code into a code train of pulses, said code train of pulses being developed over a predetermined time period, said means for converting converting a said digital data code representative of zero into an absence of pulses during said predetermined time period; and
   means, operatively connected to said means for converting, for integrating each said code train of pulses into an analog value associated therewith to thereby develop an analog waveform from said data train;
   said means for converting comprising,
   pulse number modulation means, receiving said M bit lower order code portion of each said digital data code, for developing a number of pulses in said code train of pulses equal to the digital value of said M bit lower order code portion,
   pulse width modulation means, receiving said N bit higher order code portion of said digital data code, for developing a plurality of width modulated pulses one greater in number than the maximum number of pulses developed by said pulse number modulation means, each of said plurality of width modulated pulses increasing in width in relation to the digital value of said N bit higher order code portion.

10. The converter of claim 9 wherein said digital data codes are binary codes.

11. The converter of claim 9 wherein said code train of pulses are of unitary voltage magnitude.

12. The converter of claim 9 wherein said width modulated pulses developed by said pulse width modulation means are produced thereby at equidistant intervals in said predetermined time period.

13. The converter of claim 12 wherein the pulses developed by said pulse number modulation means, when less than said maximum number, are produced at only certain of said equidistant intervals.

14. The converter of claim 9 wherein M is equal to two and N is equal to three.

15. The converter of claim 9 wherein said means for converting converts a said digital data code representing a maximum representable number into a single pulse of a width substantially equal to said predetermined time duration.

16. The converter of claim 9 further comprising timing counter means for developing timing signals, said timing counter means supplying said timing signals to said means for converting to time the location of said number of pulses developed by said pulse number modulation means and the location and width of said width modulated pulses developed by said pulse width modulation means.

17. The converter of claim 9 wherein said pulse width modulation means locates all but one of said width modulated pulses in juxtaposition to the location of a one of said maximum number of pulses developed by said pulse number modulation means.

18. A modulation circuit of a digital to analog converter for converting a digital data code into a pulse train of unitary pulses for integration to develop an analog value representative thereof comprising:

pulse number modulation means for developing an output having a varying number of pulses corresponding to the values of selected digital data bits of said digital data code during a predetermined conversion period;

pulse width modulation means for developing an output including pulses during said predetermined conversion period, said predetermined conversion period being divided into a predetermined number of segments, each said segment having an associated pulse developed therein, said pulses being developed of widths determined by the value of the remaining digital data bits; and combination means for combining the outputs of the pulse number modulation means and the pulse width modulation means by positioning a pulse from the output of the pulse width modulation means in juxtaposition with a pulse from the output of the pulse number modulation means to produce a resultant said pulse train, said resultant said pulse train consisting of a varying number of pulses for lower range and high range values of said digital data code and a constant number of pulses for medium range data values of said digital data code.

* * * * *